(12) United States Patent
Nölscher

(10) Patent No.: US 7,491,474 B2
(45) Date of Patent: Feb. 17, 2009

(54) MASKS FOR LITHOGRAPHIC IMAGINGS AND METHODS FOR FABRICATING THE SAME

(75) Inventor: Christoph Nölscher, Nürnberg (DE)

(73) Assignee: Infineon Technologies AG, Neubiberg (DE)

( * ) Notice: Subject to any disclaimer, the term of this patent is extended or adjusted under 35 U.S.C. 154(b) by 739 days.

(21) Appl. No.: 11/106,719

(22) Filed: Apr. 15, 2005

(65) Prior Publication Data
US 2005/0238966 A1    Oct. 27, 2005

(30) Foreign Application Priority Data
Apr. 23, 2004    (DE)    ............ 10 2004 019 861

(51) Int. Cl.
*G03F 1/00*    (2006.01)
*G03C 5/00*    (2006.01)

(52) U.S. Cl. ........................... 430/5; 430/394
(58) Field of Classification Search ............ 430/5, 430/322–324, 394
See application file for complete search history.

(56) References Cited

U.S. PATENT DOCUMENTS

| 5,328,786 A | 7/1994 | Miyazaki et al. |
| 5,589,303 A | 12/1996 | DeMarco et al. |
| 6,830,702 B2 * | 12/2004 | Tzu et al. ............... 216/41 |
| 2003/0091911 A1 | 5/2003 | Noelscher |

* cited by examiner

*Primary Examiner*—Stephen Rosasco
(74) *Attorney, Agent, or Firm*—Edell, Shapiro & Finnan, LLC

(57) ABSTRACT

Masks having various types of structures, such as CPL, HTPSM, or CoG structures, are without positional error with respect to one another by defining positions of the structures on the mask by a single mask lithography step. A patterned absorber layer forms in a first region, the opaque and transparent sections of the CoG structures and, in a second region, the CPL structures by serving as a hard mask for the etching of the CPL structures for example, as trenches in the mask substrate.

27 Claims, 6 Drawing Sheets

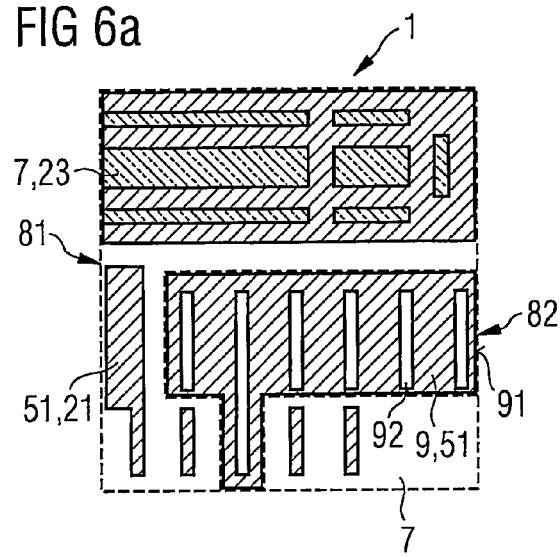
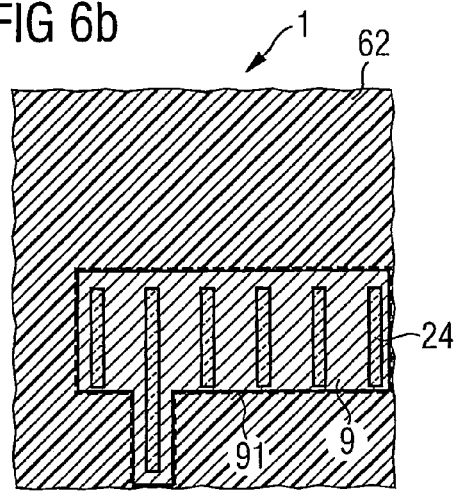
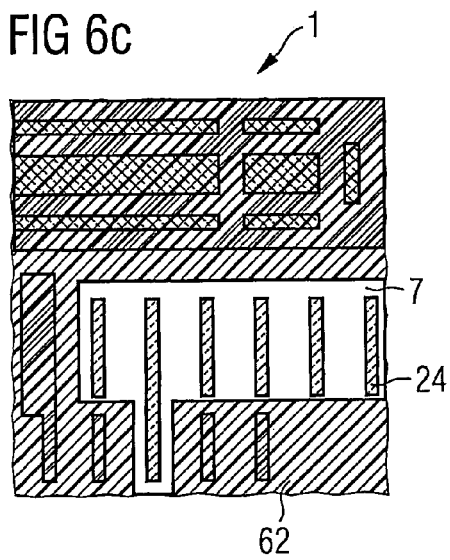
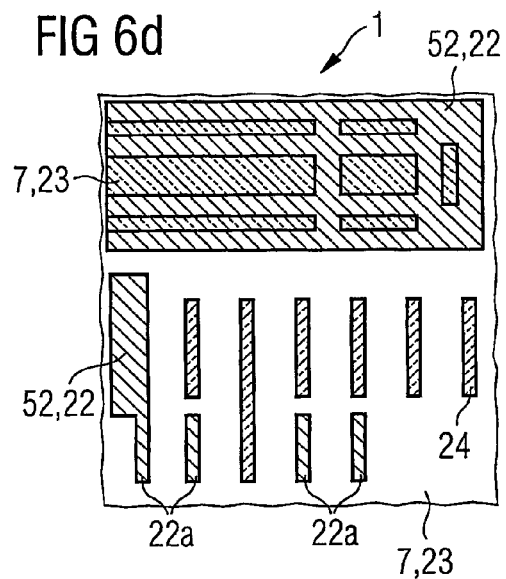

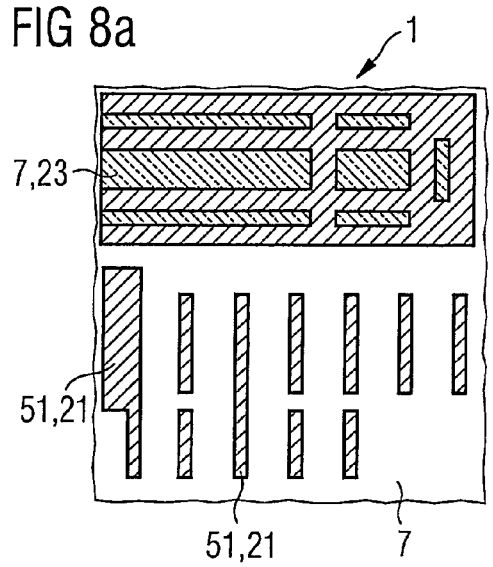
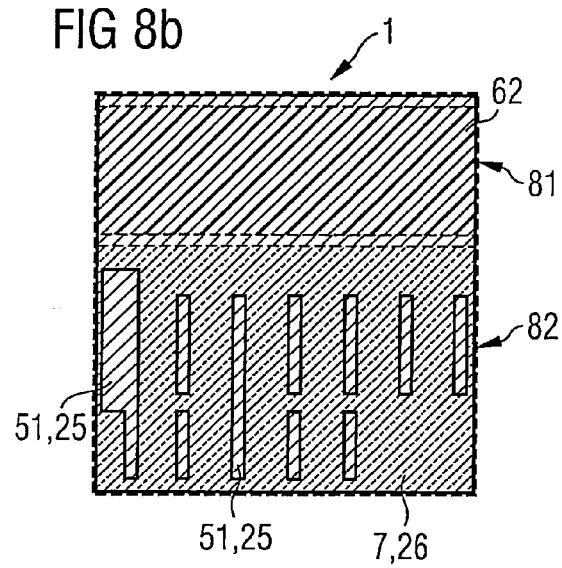
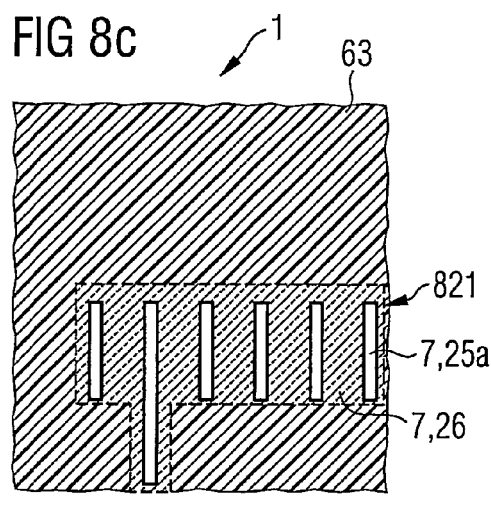
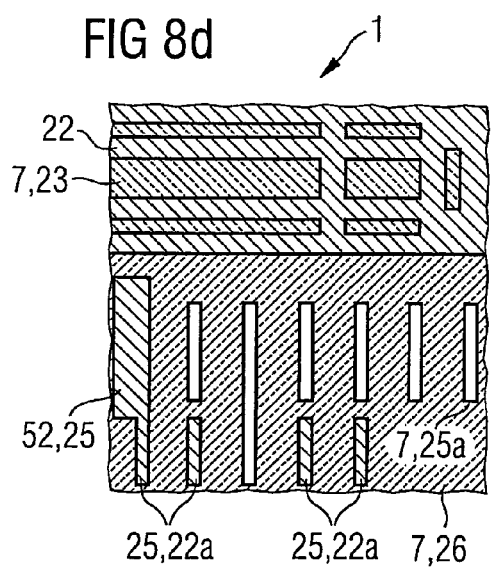

MASKS FOR LITHOGRAPHIC IMAGINGS AND METHODS FOR FABRICATING THE SAME

CROSS REFERENCE TO RELATED APPLICATIONS

This application claims priority under 35 USC §119 to German Application No. DE 10 2004 019 861.6, filed on Apr. 23, 2004, and titled "Masks for Lithographic Imagings and Method for Fabricating the Masks," the entire contents of which are hereby incorporated by reference.

FIELD OF THE INVENTION

The invention relates to a mask for a lithographic imaging of structures on the mask onto a semiconductor wafer. and to a method of fabricating the same.

BACKGROUND

Large scale integrated circuits, such as, for example, DRAM (dynamic random access memory) memory chips or logic chips, constitute complex three-dimensional arrangements in a semiconductor substrate which are fabricated in a plurality of patterning planes. A patterning plane comprises a lithographic imaging of structures predefined on a mask onto the semiconductor substrate to be patterned and subsequent etching, deposition or growth and planarization steps.

In a patterning plane, the structures are often established as lines and trenches in the semiconductor substrate which may be arranged periodically in dense fashion and insulated or semi-insulated and also have different lengths and widths. These different structures are imaged from the mask onto a photosensitive layer, provided on the semiconductor wafer, by an exposure step.

FIG. 1 shows a simplified illustration of a detail from a circuit layout 3 or a pattern to be formed on a semiconductor wafer and has both narrow, periodic, and densely arranged structures 33 and wide structures 35 and structures 31, 32, 34 arranged in insulated or semi-insulated fashion. Areas depicted dark in the illustration represent lines, i.e., elevated structure elements, in other words non-etched areas, on the semiconductor wafer.

The insulated contact structure 32 corresponds, for example, to a contact hole on the semiconductor wafer, which may be fabricated by irradiation of a corresponding light-transmissive section in the mask into a photosensitive layer on the semiconductor wafer (positive resist), subsequent development and transfer into an underlying layer in an etching step.

The structures contained in the circuit layout differ not only with regard to their length and width, but also with regard to their surroundings. In a real imaging process, insulated or semi-insulated structures are imaged differently than periodically arranged structures in the case of which an individual structure is situated in the vicinity of other structures. Periodically and densely arranged, narrow structures having dimensions close to the resolution limit of the imaging apparatus are imaged with a different quality than wide structures having dimensions further above the resolution limit of the imaging apparatus and/or insulated structures.

In order that the structures contained in the circuit layout described are transferred onto the semiconductor wafer, a mask layout is designed for a mask for a photolithographic imaging of structures on the mask onto the semiconductor wafer.

One example of a mask layout to be assigned to the circuit layout described and account for the different imaging behavior of different structures is illustrated in FIG. 2. Narrow structures 2 that are arranged densely in the circuit layout with critical dimensions with regard to the resolution capability of the imaging apparatus are embodied using CPL (chromeless phase edge lithography) technology. In this case, the structures 2 are etched as trenches 24 into the planar surface 71 of a transparent mask substrate 7 with a depth in the case of which a light beam transmitted by the mask substrate 7 through a trench 24 has a phase shift by half a wavelength relative to a light beam transmitted by the mask substrate 7 through the planar surface 71.

The structure formation on the semiconductor wafer is effected, inter alia, due to destructive interference of light beams that traverse the transparent mask substrate 7 in the region of the trench edges. In this case, the trenches 24 are made narrow so that two adjacent trench edges lead to a line formation in the resist in the semiconductor wafer. The lines are superimposed in terms of their sidewalls and thus merge to form a common line. Wide structures are formed in accordance with the mask layout 12 using HTPSM (half tone phase shifting mask) technology. In this technology, the structures are realized by semitransparent, phase-shifting sections 22 with a transmission of, for example, 6% and transparent sections 23. For periodizing structures 31, 32, 34 that are insulated and semi-insulated in the circuit layout 3, SRAF (sub-resolution assist features) structures 22a are provided as semitransparent, phase-shifting or transparent sections 22, 23 in the mask layout 12. The sections improve the imaging quality, essentially the depth of field, of the structures 2 and, since they are provided with dimensions below the resolution limit of the optical system, they are not concomitantly imaged onto the semiconductor wafer.

FIG. 2 illustrates the transparent mask substrate 7 with the trenches 24. The semi-insulated trench 24 is periodized by the SRAF structures 22a comprising semitransparent, phase-shifting material shown. The figure illustrates the semitransparent, phase-shifting sections 22 and the transparent sections 23, with which structures having less critical dimensions with regard to the resolution capability of the imaging apparatus are imaged onto the semiconductor wafer. The transparent section 23, which is surrounded by phase-shifting sections 22, is periodized by SRAF structures 22a that are likewise embodied as transparent sections 22. The dashed lines illustrated in the figure specify the lengths and widths of the structures 2 on the semiconductor wafer. In order to compensate for the line shortening effect that occurs during imaging, the structures in the mask layout are provided with adapted dimensions.

In order to fabricate a mask with the mask layout described in FIG. 2, the phase-shifting, semitransparent sections and the trenches are conventionally patterned in separate mask lithography steps.

FIG. 3 illustrates a mask blank 11 with a transparent mask substrate 7 with a planar surface 71. A semitransparent, phase-shifting layer 52 is provided on the surface 71. A light-absorbing absorber layer 51 is provided on the phase-shifting layer 52 and a photosensitive first resist layer 61 is provided on the absorber layer 51.

In a first mask lithography step, the layout for structures that are formed as semitransparent phase-shifting and transparent sections on the mask is imaged onto the resist layer, e.g., by an electron beam writer. After developing the resist layer, he structures are transferred into the absorber layer and the underlying semitransparent phase-shifting layer by means of an etching step.

For patterning the trenches in the transparent mask substrate, a new resist layer is applied, which is patterned in a second mask lithography step. The layout for the trenches is transferred into the resist layer, for example, by an electron beam writer. A subsequent development of the resist layer opens those regions of the resist layer at which trenches are intended to be etched into the transparent mask substrate. After the patterning of the resist layer, the trenches are etched into the mask substrate. The resist layer is then removed and, in order to form the phase-shifting sections, the patterned absorber layer is removed in a further etching step, so that the structures are formed by the patterned phase-shifting layer.

FIGS. 4A, 4B, and 4C show the mask 1 after three different stages of processing. FIG. 4A illustrates the mask 1 after the transfer of the structures formed as semitransparent, phase-shifting sections 22 and transparent sections 23. The patterned absorber layer 51, which forms opaque sections 21 on the transparent mask substrate 7, can be seen. The new resist layer 6 patterned in a second mask lithography step can be discerned in FIG. 4B. The resist layer 6 has openings through which trenches 24 etched into the mask substrate 7 are visible. After the trenches 24 have been etched into the mask substrate 7, the resist layer 6 is removed. FIG. 4C illustrates the mask 1 after the removal of the resist layer 6 and the absorber layer 51. The mask substrate 7, the trenches 24 etched into the mask substrate 7, the SRAF structures 22a, which are formed as semitransparent, phase-shifting sections 22, and the semitransparent, phase-shifting sections 22 that emerge from the patterned semitransparent phase-shifting layer 52 can be seen. The transparent sections 23 illustrated and also the transparent SRAF structures 22a emerge from the patterned phase-shifting layer 52 as openings at which the transparent mask substrate 7 becomes visible.

The conventional fabrication method described gives rise to a positional error with respect to one another among the structures produced by the different technologies, since the different structures are fabricated in two different mask lithography steps on the mask. The structures etched as trenches into the mask substrate have to be aligned with the structures formed as initially opaque sections. Since this can be done only with a limited alignment accuracy, an overlay error always arises and, under certain circumstances, again nullifies the advantage of the mask with differently formed structures. A further difficulty in the case of the mask fabrication described arises during the etching of the trenches into the mask substrate, in the case of which the patterned resist layer is used as an etching mask. Due to fluctuations in the resist profile in connection with resist removal, this leads to dimensional losses and feature size fluctuations on the mask.

In order to fabricate a mask with MESA-CPL structures, instead of the trench-CPL structures, a method analogous to the fabrication of the mask with trench-CPL structures is employed. MESA-CPL structures are understood here to be structures that are formed as transparent elevations in the mask substrate. In order to form suitable elevations, the mask substrate is partially etched back, thus resulting in depressions. The height difference is chosen such that a light beam that passes through the mask substrate through the non-etched surface at the elevations has a phase shift by half a wavelength relative to a light beam that passes through the mask substrate through the depression. The imaging on the semiconductor wafer is based on the same principle as in the case of the trench-CPL structures.

The conventional method for fabricating the mask with MESA-CPL structures and with structures that are formed by semitransparent, phase-shifting or opaque and transparent sections has, in accordance with FIGS. 5A-5C, in part the same process steps as the method already described.

FIGS. 5A, 5B, and 5C illustrate the mask with MESA-CPL structures in three different stages of processing. FIG. 5A shows the mask 1 after the first mask lithography, in the course of which the absorber layer 51 is patterned. FIG. 5A does not differ from FIG. 4A. The structures that are later formed as semitransparent, phase-shifting and transparent sections 22, 23 are transferred onto the mask 1 by the first lithography step. Afterward, a further resist layer 6 is applied and patterned by a second lithography step 5. This opens the resist layer 6 at the locations at which the mask substrate 7 is etched back. The resist layer 6 remains as an etching mask at the locations at which elevations 25 are formed. The resist layer 6 furthermore continues to cover regions in which the structures are formed as semitransparent phase-shifting or opaque and transparent sections 22, 21, 23. FIG. 5B illustrates the mask 1 with the patterned resist layer 6 after the depressions 26 have been etched into the mask substrate 7. The SRAF structures 22a formed as initially opaque sections 21 and the patterned absorber layer 51 can furthermore been seen. After the etching of the depressions 26, the resist layer 6 is removed and then the absorber layer 51 is removed. FIG. 5C illustrates the mask after the removal of the absorber layer 51 and the resist layer 6. FIG. 5C differs from FIG. 4C in that, instead of the trenches 24, elevations 25 are formed in the mask substrate 7.

The fabrication of the mask with MESA-CPL structures gives rise to the same difficulties as in the fabrication of the mask with trench-CPL structures. In the second mask lithography, the structures formed as elevations are aligned with the structures formed as phase-shifting sections. An overlay error occurs since the mask, after the first mask lithography, is removed from the mask writer and etched and cleaned and newly coated with resist and the resist is patterned. In this case, the second lithography plane is produced with the device-specific, limited alignment accuracy with respect to the first lithography plane.

In the case of the mask with MESA-CPL structures, too, resist structures serve as an etching mask for etching the depressions into the mask substrate. Dimensional losses and feature size fluctuations on the mask may likewise occur in this case, on account for example of fluctuations in the resist profile in connection with a resist removal.

A method for fabricating a mask having different types of structures by which a type of structures formed as trenches in the mask substrate can be positioned in a self-aligning manner, i.e., without positional errors, with respect to a type of structures formed as semitransparent, phase-shifting or opaque sections on the mask. A mask fabricated by the method are desirable. Further, a method for fabricating a mask in which elevations, instead of the trenches, elevations are formed in the mask substrate, and the mask fabricated by the method are desirable.

SUMMARY

A method for fabricating a mask for a lithographic imaging of structures on the mask onto a semiconductor wafer is described below. The mask has a transparent mask substrate with a surface with a first and a second region. The structures are formed by transparent and opaque, or semitransparent, phase-shifting sections in the first region and by phase-shifting trenches in the mask substrate in the second region.

In the method, a mask blank with the mask substrate is provided, a light-absorbing absorber layer is provided on or above the surface, and a photosensitive first resist layer is provided on the absorber layer. For the first case, where the structures are formed by transparent and opaque sections in the first region, the absorber layer is provided on the surface of the mask substrate. For the second case, where the structures are formed by transparent and semitransparent, phase-shifting sections in the first region, a semitransparent, phase-shifting layer is provided on the surface and the absorber layer is provided on the phase-shifting layer, so that the absorber layer is provided above the surface.

In a first lithography step, according to an embodiment of the invention, a size and position of the second region with respect to the first region are defined and the structures to be formed in the first and in the second region are transferred into the first resist layer. The transfer of the structures into the first resist layer may be effected, for example, by an electron beam writer and a subsequent development of the resist layer. After development, the resist layer has regions that are open in accordance with the structures to be transferred.

Before the first lithography step is performed, a target layout to be imaged onto the semiconductor wafer by the mask may be decomposed into the first and the second region in a computer program with at least one separating edge that exists as a data structure and is not imaged into the final structure on the semiconductor wafer.

The structures formed in the first resist layer are transferred into the absorber layer, in which process, for the first case, with the patterned absorber layer, the transparent and the opaque sections are formed in the first region and the structures are defined in the second region. The definition of the structures is understood here to mean that both a position of the structures on the mask and a size of the structures are defined by the patterned absorber layer in the second region. The transfer of the structures from the resist layer into the absorber layer may be effected, for example, by an etching step. In this case, the absorber layer is etched away and the mask substrate is uncovered at the locations at which the resist layer is opened.

After the structures have been transferred into the absorber layer, the first resist layer is removed and a photosensitive second resist layer is applied. The second resist layer is patterned in a second lithography step, the second region being almost completely opened and the first region remaining covered.

Trenches are etched into the uncovered mask substrate with the patterned absorber layer in the second region as a hard mask. The absorber layer is patterned in the second region such that openings are provided in the absorber layer at the locations at which the trenches are etched into the mask substrate. The absorber layer serves as a hard mask for etching the trenches in the second region.

After the etching of the trenches, the hard mask is removed in the second region and the second resist layer is removed. As a result of the removal of the hard mask, for example, by an etching process, the mask substrate is thus uncovered in the second region. The structures are formed by trenches in the transparent mask substrate in the second region. Apart from the trenches, the surface is embodied as a planar area.

In the method according to the invention, the structures that are to be formed differently in the first and in the second region are transferred simultaneously into the absorber layer in the first lithography step. According to the invention, the patterned absorber layer fulfills different functions in the two regions. In the first region, with the patterned absorber layer, the structures on the mask are formed as transparent and opaque sections. In the second region, the patterned absorber layer fulfills the function of the hard mask for etching the trenches into the mask substrate. The size and the position of the second region with respect to the first region are defined by the size and the position of the hard mask. The structures formed as openings in the hard mask define a dimensioning and positioning of the trenches in the mask substrate. The fact that the positions of the structures on the mask are transferred in a single lithography step eliminates the overlay error that arises from different types of structures being transferred onto the mask in different lithography steps that have to be aligned with one another.

The second lithography step of the method according to the invention does not impose any stringent requirements on an alignment accuracy. The second region is almost completely uncovered. Almost completely means that the hard mask need not be uncovered in its entirety. In order to ensure that the mask substrate is not incipiently etched outside the trenches, there may be an overlap region between the hard mask and the second resist layer in the context of the alignment accuracy. The size of the hard mask is chosen such that the openings remain free in the hard mask despite the overlap region.

The method according to the invention makes it possible to fabricate a mask with different types of structures in which the different types of structures are positioned without any alignment errors with respect to one another. Because the positions of the types of structures are transferred in a single lithography step means that error that arises as a result of the types of structures being positioned one on top of the other in two lithography steps is avoided. The absorber layer functions as a hard mask in the second region. Since the hard mask is used for etching the trenches, errors such as, for example, feature size fluctuations on the mask due to fluctuations in the resist profile in connection with a resist removal, which occur in the course of etching with a resist layer as an etching mask, are avoided. The method according to the invention makes it possible to cost-effectively to preclude sources of error in the fabrication of the mask and thus improve the quality of the mask. Fewer rejects are produced, which reduces the costs of fabrication of the mask.

With the method according to the invention, the structures in the first region are formed not only as transparent and opaque sections, but also as transparent and semitransparent, phase-shifting sections. Preferably, in order to produce the phase-shifting sections, the mask blank with a semitransparent, phase-shifting layer arranged on the surface below the absorber layer is provided. The phase-shifting layer uncovered in openings of the patterned absorber layer is removed. The phase-shifting layer is patterned and the mask substrate is uncovered in the openings. After removal of the hard mask, the phase-shifting layer is removed in the second region, so that, in the second region, the structures are formed by trenches in the transparent mask substrate. After removal of the second resist layer, the patterned absorber layer is removed in the first region, so that, in the first region, the semitransparent, phase-shifting sections emerge from the patterned phase-shifting layer.

Preferably, a depth of the trenches is provided such that a light beam transmitted by the mask substrate within the trenches has a phase shift of half a wavelength relative to a light beam transmitted by the mask substrate through the surface outside the trenches. Given a phase difference of half a wavelength, the images on the semiconductor wafer arise as dark strips that are produced as a result of a destructive interference of light beams transmitted through the mask substrate in the region of the trench edges.

The size and the position of the second region with respect to the first region are defined by an outer edge that completely surrounds the hard mask. The hard mask is described by specifications regarding the length of the outer edge and its position on the mask. The outer edge is the edge of the hard mask.

Preferably, the outer edge is provided at a distance from the openings in the hard mask that define the structures in the second region. The openings in the hard mask define the location at which the trenches are etched into the mask substrate. The dimensions of the hard mask should are provided such that, during the patterning of the second resist layer, in the course of which the second resist layer is opened in the second region, there may be an overlap region between the second resist layer and the hard mask in the context of the alignment accuracy, so that the openings are not covered by the second resist layer and the mask substrate is not uncovered outside the trenches.

Preferably, the distance between the outer edge and the openings is a value of in the range between 50 and 100 nanometers. In that range, the second resist layer, in the context of the alignment accuracy, never covers the openings in the hard mask.

As an alternative, the outer edge is provided at a distance from the opaque or phase-shifting sections in the first region.

Preferably, the distance between the opaque or phase-shifting sections is a value in the range of between 70 and 150 nanometers.

Preferably, the second resist layer is patterned by carrying out a second lithography step and a subsequent development step, so that the outer edge and an overlap region extending along the outer edge, within the hard mask, are covered by the second resist layer. The overlap region ensures that no mask substrate outside the hard mask is uncovered by alignment inaccuracies and exposed to an etching attack.

Preferably, a width of the extending overlap region is provided such that a covering of the mask substrate is ensured in the context of an alignment accuracy.

The hard mask and, if provided, the underlying phase-shifting layer are removed by an etching process with a defined undercut under the second resist layer. The defined undercut also removes the regions of the hard mask and of the phase-shifting layer which are covered due to the overlap region by the second resist layer.

An alternative possibility for removal of the hard mask and, if provided, of the underlying phase-shifting layer, is a third lithography step is effected to enlarge an opening, which almost completely uncovers the second region in the second resist layer in the second region, so that the hard mask and a region of the mask substrate that extends along the outer edge are uncovered. The hard mask and, if provided, the underlying phase-shifting layer are removed by a selective etching process.

Preferably, quartz is the material for the mask substrate.

Preferably, chrome is the material for the absorber layer.

Preferably, molybdenum silicide is the phase-shifting layer.

A mask for a lithographic imaging of structures on the mask onto a semiconductor wafer is described below. The mask has a transparent mask substrate with a surface. The structures are formed by transparent and opaque, or semitransparent phase-shifting sections in a first region of the mask and by trenches in the mask substrate in a second region of the mask. According to the invention, the structures formed in the mask emerged from the method according to the invention as described above. The mask has structures formed in the second region that have no positional error with respect to the structures formed in the first region. The mask according to the invention allows use of advantages associated with the mask with different types of structures during the lithographic imaging.

A method for fabricating a mask for a lithographic imaging of structures on the mask onto a semiconductor wafer is described below. The mask has a transparent mask substrate with a surface with a first and a second region and, in the first region, the surface being planar and the structures being formed by transparent and opaque, or semitransparent, phase-shifting sections and, in the second region, being formed by transparent and opaque, or semitransparent, phase-shifting elevations and transparent depressions in the mask substrate.

The second region has a partial region and, in the partial region, the structures are formed by transparent elevations and transparent depressions in the mask substrate.

A mask blank with the mask substrate is provided, a light-absorbing absorber layer is provided on or above the surface and a photosensitive first resist layer provided on the absorber layer. The absorber layer is provided on the surface, if the structures in the first case are formed by transparent and opaque sections in the first region and by opaque elevations in the second region.

According to the invention, in a first lithography step, the structures to be formed in the first and in the second region are transferred into the first resist layer. The structures formed in the first resist layer are transferred into the absorber layer, in which process, in the first case, according to the invention, with the patterned absorber layer, the transparent and opaque sections are formed in the first region and the structures are defined in the second region. The definition of the structures is understood here to mean that both a position of the structures on the mask and a size of the structures are defined by the patterned absorber layer in the second region.

Before the first lithography step is performed, a target layout to be imaged onto the semiconductor wafer by the mask may be decomposed into the first and the second region in a computer program with at least one separating edge that exists as a data structure and is not imaged into the final structure on the semiconductor wafer.

The first resist layer is removed and a photosensitive second resist layer is applied. The second resist layer is patterned in a second lithography step, the second region being opened. Depressions are etched into the uncovered mask substrate, with the patterned absorber layer in the second region as a hard mask. The opaque elevations and the transparent depressions are formed during this step. After the removal of the second resist layer, a photosensitive third resist layer is applied and patterned, the partial region being opened. The hard mask is removed in the opened partial region, as a result of which the transparent elevations are formed. The third resist layer is subsequently removed.

The method according to the invention for fabricating a mask with MESA-CPL structures, i.e., structures formed as transparent elevations in the transparent mask substrate, transfers information about the structures, such as position and size, in a single lithography step. This avoids the positional error among different types of structures that occurs in conventional methods requiring a plurality of lithography steps. Furthermore, by providing a hard mask used to mask the elevations formed as bridges, a precise etching process and the repair of phase defects on the mask, i.e., undesirable elevations on the mask where they are not intended to be are possible.

Preferably, in order to fabricate a mask with transparent, phase-shifting sections and elevations, the mask blank with a semitransparent phase-shifting layer arranged on the surface, below the absorber layer, is provided. The phase-shifting layer that is uncovered in openings of the patterned absorber layer is removed, so that the mask substrate is uncovered. After removal of the hard mask, before the removal of the third resist layer, the uncovered phase-shifting layer is removed, the transparent elevations being formed in the partial region. After removal of the third resist layer, the absorber layer is removed in the first region and in the second region, so that the semitransparent phase-shifting sections are formed in the first region and the semitransparent phase-shifting elevations are formed in the second region.

Preferably, a height difference between the depressions and the elevations is such that a light beam transmitted by the mask substrate within the depressions has a phase shift of half a wavelength relative to a light beam transmitted by the mask substrate through the transparent elevations. The imaging principle here is the same as in the case of the mask already described in which the structures are formed by trenches in the mask substrate.

Preferably, a size and position of the partial region with respect to the second region are defined by an outer edge of an opening in the third resist layer.

The outer edge is at a distance from the transparent elevations in the partial region. The distance avoids errors that may be effected as a result of patterning inaccuracies or alignment inaccuracies.

Preferably, the distance between the outer edge and the transparent elevations is a value in the range of between 50 and 100 nanometers.

As an alternative, the outer edge is provided at a distance from the opaque or phase-shifting sections and elevations.

The distance between the opaque or phase-shifting sections and elevations is a value in the range of between 70 and 150 nanometers.

Quartz is the material for the mask substrate, chrome is the material for the absorber layer, and molybdenum silicide is the material for the phase-shifting layer.

For carrying out the methods according to the invention, both positive and negative resists can be used for the resist layers on the mask. Both positive and negative resists may likewise be used for producing structures on the semiconductor wafer.

A mask for a lithographic imaging of structures on the mask onto a semiconductor wafer is provided. The mask has a transparent mask substrate with a surface with a first and a second region. The surface is planar in the first region and the structures are formed by transparent and opaque, or semitransparent phase-shifting sections and. In the second region, the structures are formed by transparent and opaque or semitransparent phase-shifting elevations and transparent depressions in the mask substrate. The second region has a partial region and, in the partial region, the structures are formed by transparent elevations and transparent depressions in the mask substrate. The structures formed in the mask according to the invention emerged from the method according to the invention as described above. With such a mask is that the differently formed structures have no positional error with respect to one another.

BRIEF DESCRIPTION OF THE DRAWINGS

The invention is explained in more detail below based on the basis of the exemplary embodiments illustrated in the drawings.

FIGS. 6A-6D show plan views of a mask with trench-CPL structures in various stages of processing in accordance with a first exemplary embodiment of the invention.

FIGS. 8A-8D show plan views of a mask with MESA-CPL structures in various stages of processing in accordance with an exemplary embodiment of the method according to the invention.

DETAILED DESCRIPTION

Figure 1:
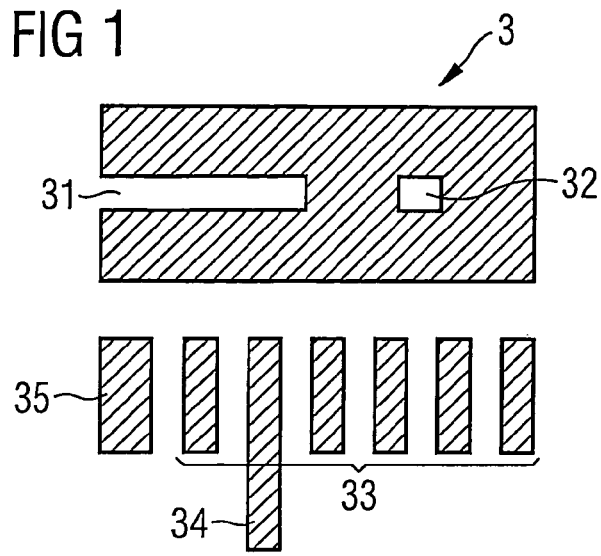
FIG. 1 shows a schematic circuit layout.
Figure 2:
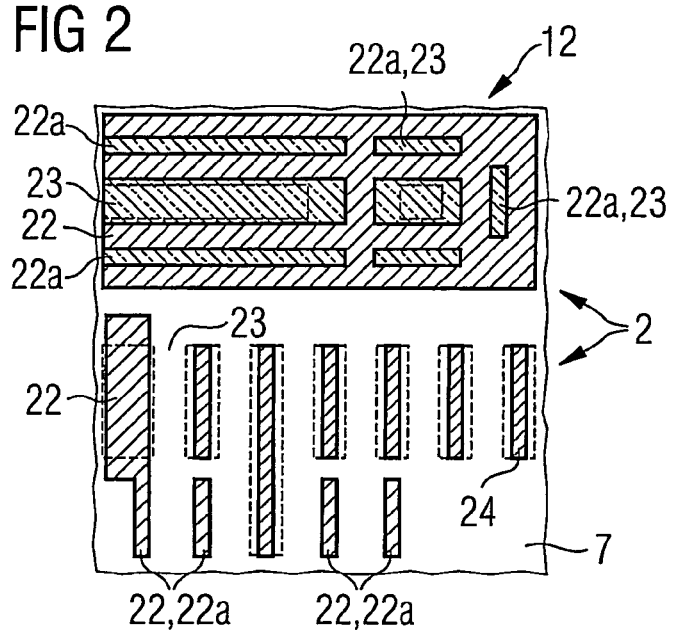
FIG. 2 shows a schematic mask layout.
Figure 3:
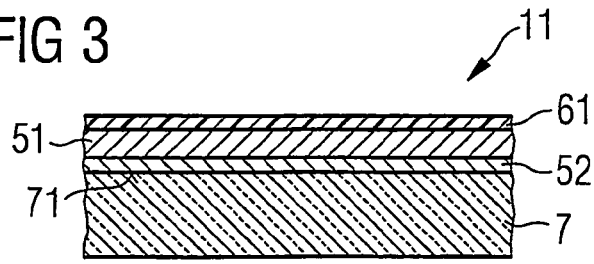
FIG. 3 shows a cross section through a mask blank.
Figure 4A:
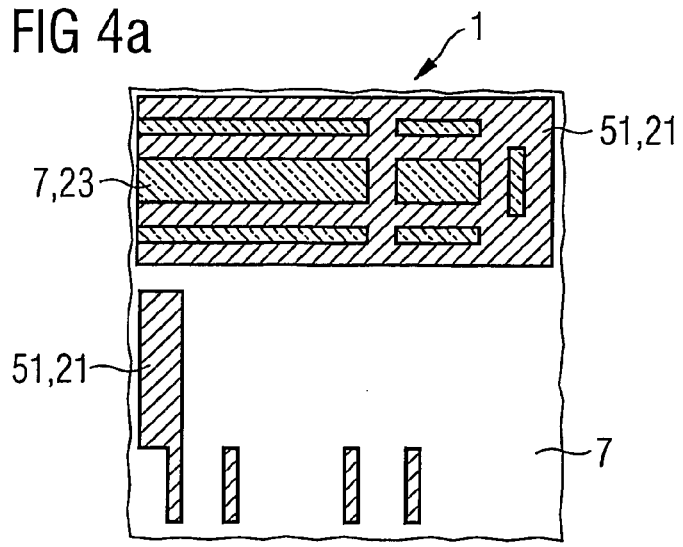
FIGS. 4A, 4B, 4C shows plan views of a mask with trench-CPL structures in various stages of processing.
Figure 4B:
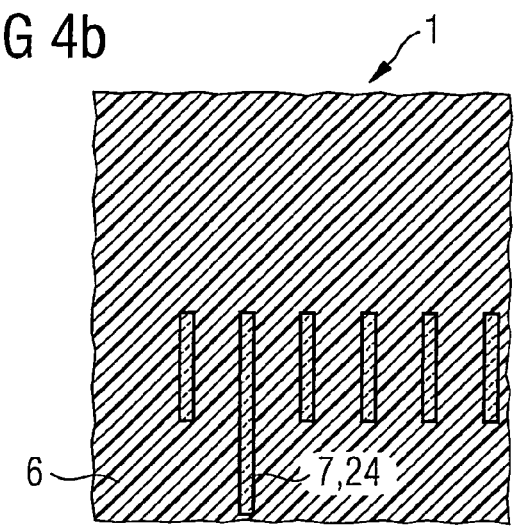
Figure 4C:
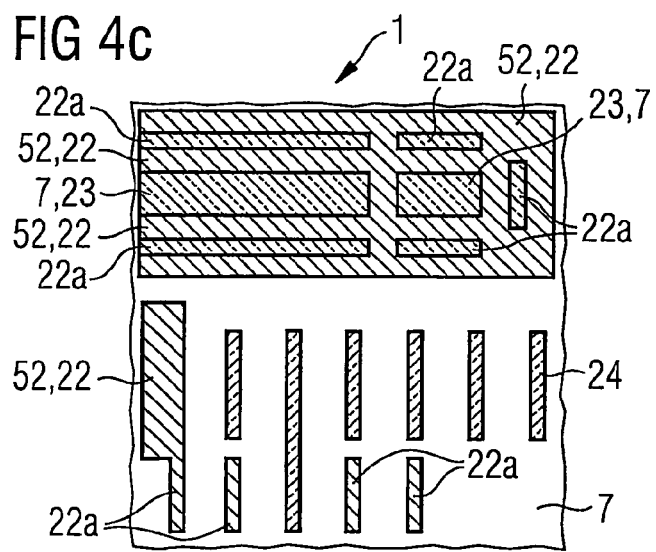
Figure 5A:
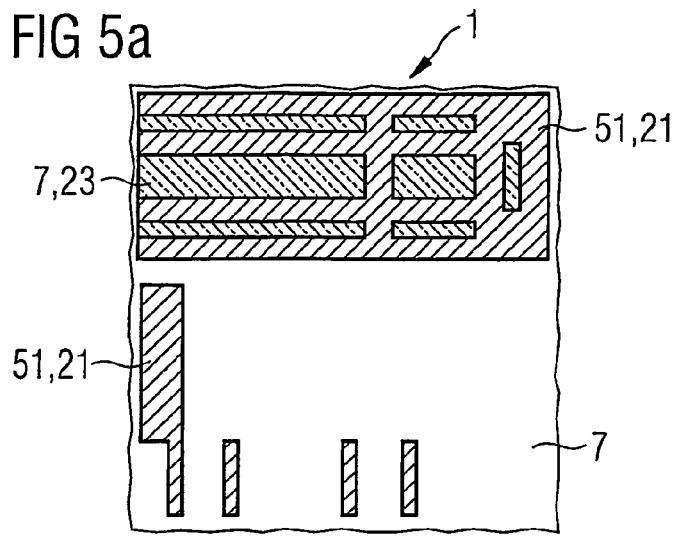
FIGS. 5A, 5B, and 5C show plan views of a mask with MESA-CPL structures in various stages of processing.
Figure 5B:
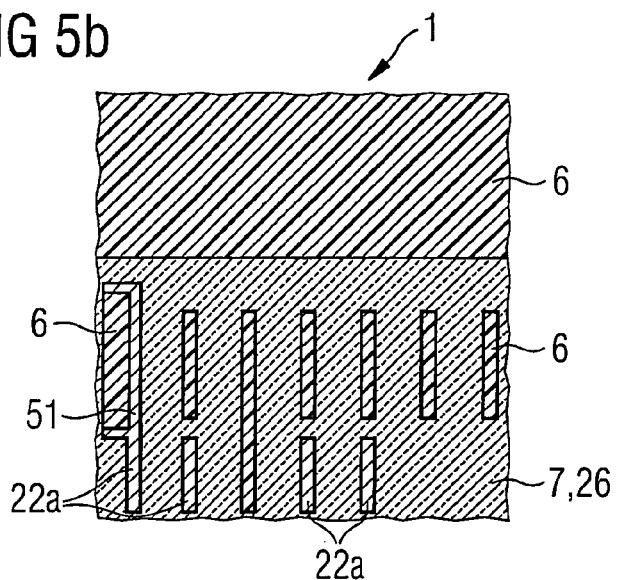
Figure 5C:
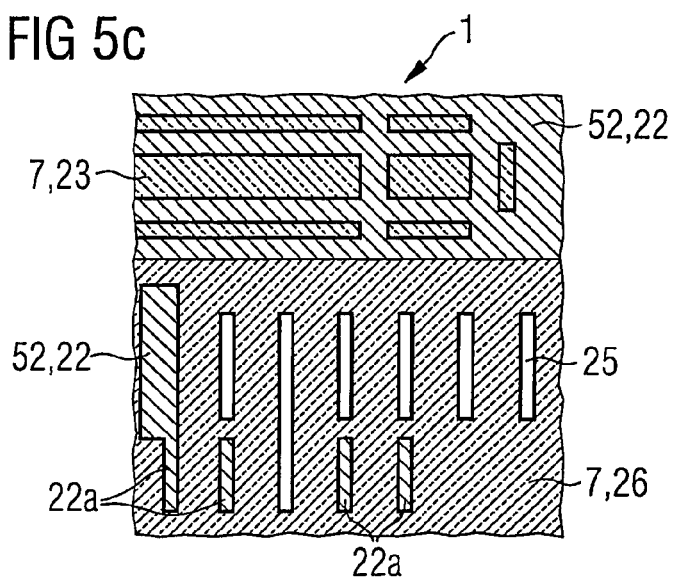

FIGS. 6A-6D illustrate method steps for fabricating a mask 1 for a lithographic imaging of structures on the mask onto a semiconductor wafer. The mask 1 has a transparent mask substrate 7 with a surface 71 with a first and a second region 81, 82. The structures 2 are formed by transparent and semitransparent, phase-shifting sections 23, 21, 22 in the first region 81 and by trenches 24 in the mask substrate 7 in the second region 82.

In the method, a mask blank 11 with the mask substrate 7 is provided, a semitransparent, phase-shifting layer 52 is provided on the surface 71, a light-absorbing absorber layer 51 is provided on the phase-shifting layer 52, and a photosensitive first resist layer 61 is applied on the absorber layer 51.

In a first lithography step, a size and a position of the second region 82 with respect to the first region 81 are defined and the structures 2 to be formed in the first and in the second region 81, 82 are transferred into the first resist layer 61. The structures 2 formed in the first resist layer 61 are then transferred into the absorber layer 51, for example, by an etching process. If the absorber layer 51 is a chrome layer, then a chrome etching process is to be employed.

After the patterning of the absorber layer 51, which has resulted in open locations in the absorber layer 51, the phase-shifting layer 52 is removed at the open locations, so that the mask substrate 7 is uncovered.

With the patterned absorber layer 51, the transparent and opaque sections 21, 23 are formed in the first region 81 and the structures 2 are defined in the second region 82. The definition of the structures 2 is understood here to mean that a position on the mask 1 and the dimensioning of the structures 2 are defined. After the structures 2 have been transferred into the absorber layer 51, the first resist layer 61 is removed.

A second photosensitive resist layer 62 is then applied to the patterned absorber layer 51. By a second lithography step, the second resist layer 62 is patterned such that the second region 82 is almost completely opened, which means that all the openings 92 etched into the absorber layer 51 in the second region 82 are uncovered. This is followed by the etching of the trenches 24 in the openings 92 of the patterned absorber layer 51 serving as a hard mask 9 in the second region 82.

After etching the trenches 24, the hard mask 9 and the semitransparent, phase-shifting layer 52 provided below the hard mask 9 are removed. This may be carried out by a chrome etching process and an etching process for the phase-shifting layer 52, which, however, should be effected selectively with respect to the underlying mask substrate 7. The second resist layer 62 is subsequently removed. This is followed by another chrome etching step for removing the absorber layer 51, so that the structures 2 are formed as phase-shifting and transparent sections 22, 23 in the first region 81.

FIG. 6A illustrates the mask 1 after the patterning of the absorber layer 51. The first region 81 can be seen, in which the structures are formed as transparent sections 23, which emerge from the transparent mask substrate 7, and as opaque sections 21, which emerge from the absorber layer 51. The illustration shows the hard mask 9 that has emerged from the absorber layer 51 in the second region 82. The hard mask 9 has openings 92 that are used to define the position and the size of the trenches 24 on the mask 1. The size of the second region 82 is described by a length and form of the outer edge 91 of the hard mask 9. The outer edge is illustrated as a dashed line in FIG. 6a. The mask substrate 7 is visible at the locations at which the absorber layer 51 is not present.

FIG. 6B illustrates the mask 1 after applying and patterning the second resist layer 62 and the etching of the trenches 24 into the mask substrate 7. The hard mask 9 is visible at the locations at which the second resist layer 62 was opened. In the openings 92 of the hard mask 9, the trenches 24 have been etched into the mask substrate 7. The dashed line on the second resist layer 62 indicates the position of the outer edge 91 of the hard mask 9. The second resist layer 62 does not terminate directly with the outer edge 91, rather there is an overlap region between the hard mask 9 and the second resist layer 62. The overlap region is necessary in order that, in the context of an alignment accuracy, the mask substrate 7 is not uncovered outside the openings 92 in the hard mask 9.

FIG. 6C shows the mask 1 after the removal of the hard mask 9 and of the underlying phase-shifting layer 52. In order that the hard mask 9 and the phase-shifting layer 52 are also removed in the overlap region, a defined undercutting process is to be employed in this exemplary embodiment of the method according to the invention. The uncovered mask substrate 7, the trenches 24 etched into the mask substrate 7, and the second resist layer 62 are illustrated in FIG. 6C.

FIG. 6D shows the mask 1 after removal of the second resist layer 62 and after the removal of the absorber layer 52. The illustration shows the transparent sections 23, which emerge from the transparent mask substrate 7, and the phase-shifting sections 22, which emerge from the patterned, semi-transparent, phase-shifting layer 52. The SRAF structures 22a shown are likewise formed as phase-shifting sections. The trenches 24 etched into the transparent mask substrate 7 can furthermore be seen.

A second exemplary embodiment of the method according to the invention for fabricating the mask 1 is illustrated in FIG. 7. FIG. 7A shows the mask 1 after the patterning of the absorber layer 51. This process step does not differ from the process step illustrated in FIG. 6A. The regions 81, 82 are not depicted in FIG. 7A, however.

Figure 7A:
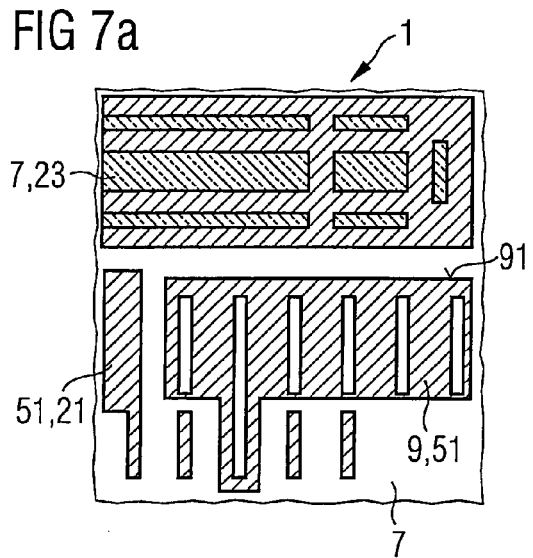
FIGS. 7A-7D show plan views of a mask with trench-CPL structures in various stages of processing in accordance with a second exemplary embodiment of the invention.
Figure 7B:
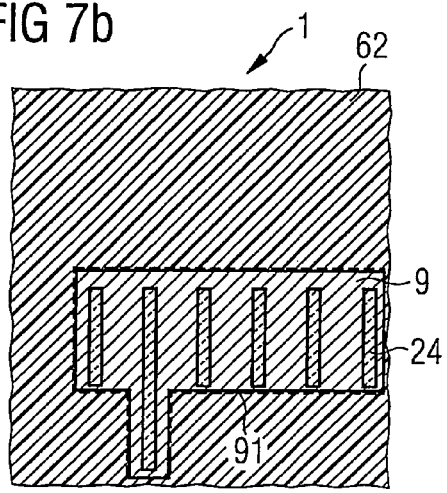

FIG. 7B reveals the second resist layer 62 after the patterning of the second resist layer 62. The second resist layer 62 patterned in the second lithography step, in accordance with FIG. 7B, does not differ from the patterned resist layer 62 in accordance with FIG. 6B.

In contrast to the method in accordance with FIG. 6, the second resist layer 62 is opened still further after introduction of the trenches 24 in a third lithography step.

Figure 7C:
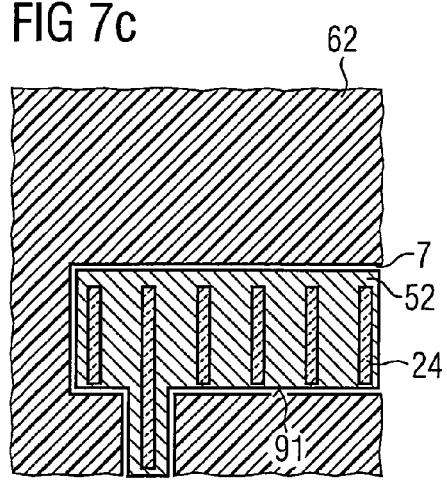

As can be discerned in FIG. 7C, the second resist layer 62 is opened to an extent such that the outer edge 91 is uncovered and a strip of mask substrate 7 extending along the outer edge 91 is uncovered. FIG. 7C shows the mask 1 after the third lithography step and removal of the hard mask 9. The illustration shows the patterned, phase-shifting layer 52 situated below the hard mask 9, the uncovered outer edge 91, the etched trenches 24, and the uncovered mask substrate 7 extending along the outer edge 91.

Figure 7D:
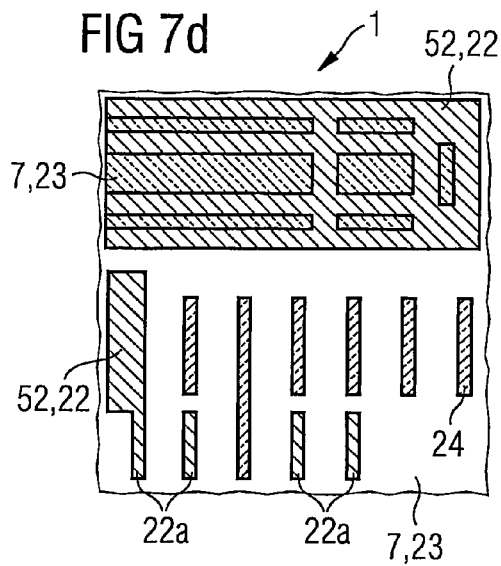

FIG. 7D illustrates the mask 1 after removal of the phase-shifting layer 52 in the second region, the second resist layer 62, and the absorber layer 51 in the first region. The mask 1 illustrated in FIG. 7D does not differ from the mask 1 illustrated in FIG. 6D.

FIG. 8 illustrates a method for fabricating a mask 1, which has a transparent mask substrate 7 with a surface 71 with a first and a second region 81, 82. The surface 71 is planar in the first region 81 and the structures 2 are formed by transparent and semitransparent, phase-shifting sections 22, 23. In the second region 82, the structures are formed by transparent and semitransparent, phase-shifting elevations 25 and transparent depressions 26 in the mask substrate 7. The second region 82 has a partial region 83 and, in the partial region 83, the structures are formed by transparent elevations 25 and transparent depressions 26 in the mask substrate 7.

In the method, the mask blank 11 with the mask substrate 7 is provided, a semitransparent, phase-shifting layer 52 is provided on the surface 71, an absorber layer 51 is provided on the phase-shifting layer 52, and a photosensitive first resist layer 61 is provided on the absorber layer 51.

In a first lithography step, the structures to be formed in the first and in the second region 81, 82 are transferred into the first resist layer 61. The structures formed in the first resist layer 61 are transferred into the absorber layer 51 and into the phase-shifting layer 52, in which case, with the patterned absorber layer 51, the transparent sections 23 and opaque sections 21 are formed in the first region 81 and the structures are defined in the second region 82.

The first resist layer 61 is removed and a photosensitive second resist layer 62 is applied. The second resist layer 62 is patterned, and the second region 82 is opened. The depressions 26 are etched into the uncovered mask substrate 7.

The patterned absorber layer 51 in the second region 82 serves as a hard mask 9. Regions covered by the hard mask 9 are formed as elevations 25 during the etching process. The etched depressions 26 represent planar areas, so that a predefined height difference between the elevation 25 and the depression 26 remains constant at least in the vicinity of critical edges.

After formation of the elevations 25 in the second region 82, a photosensitive third resist layer 63 is applied. The third resist layer 63 is patterned such that the partial region 821 is opened. In the opened partial region 821, the absorber layer 51, and o the underlying phase-shifting layer 52 are removed. This gives rise to the transparent elevations 25a.

After removal of the third resist layer 63, the absorber layer 51 is removed. The structures in the first region 81 are then formed as transparent and phase-shifting sections 23, 22. In the second region 82, outside the partial region 821, the phase-shifting elevations 25 are formed after the removal of the absorber layer 51.

FIG. 8A illustrates the mask 1 after the structures have been transferred into the absorber layer 51 and into the phase-shifting layer 52. The illustration shows the opaque sections 21 that have emerged from the patterned absorber layer 51, the mask substrate 7 and the transparent sections 23 includes the mask substrate 7.

FIG. 8B shows the first region 81 covered by the second resist layer 62 and the remaining second region 82 not covered by the second resist layer 62. The dashed line illustrated indicates an extent of the first region 81. The structures formed as elevations 25 and depressions 26 in the mask substrate 7 are illustrated in the second region 82. The elevations 25 are covered by the absorber layer 51 serving as a hard mask 9 for the etching process.

FIG. 8C reveals the mask 1 with the patterned third resist layer 63. The third resist layer 63 has an opening that uncovers the partial region 821 illustrated. The outer edge 91 is indicated by a dashed line. The mask substrate 7 and the depressions 26 and transparent elevations 25a formed in the mask substrate 7 are visible in the partial region 821.

FIG. 8D shows the mask 1 after removal of the third resist layer 63 and of the absorber layer 51. The illustration shows the transparent and phase-shifting sections 23, 22 in the first region 81, which is not explicitly depicted here again. The elevations 25 that are covered with the phase-shifting layer 52 and are used to form the SRAF structures 22a shown are illustrated in the second region (not explicitly depicted here either). The FIG. likewise reveals the transparent elevations 25a formed from the mask substrate 7 and the depressions 26 formed in the mask substrate 7.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Mask
11 Mask blank
12 Mask layout
2 Structures
21 Opaque section
22 Phase-shifting section
22a SRAF structure
23 Transparent section
24 Trench
25 Elevation
25a Transparent elevation
26 Depression
3 Circuit layout
31 Insulated structure
32 Insulated contact structure
33 Dense structures
34 Semi-insulated structure
35 Wide structure
51 Absorber layer (chrome)
52 Phase-shifting layer (semitransparent MoSi)
6 Resist layer (photosensitive resist)
61 First resist layer
62 Second resist layer
63 Third resist layer
7 Mask substrate (transparent quartz)
71 Surface
81 First region
82 Second region
821 Partial region
9 Hard mask
91 Outer edge
92 Opening

What is claimed is:

1. A method for fabricating a mask for a lithographic imaging of structures on the mask onto a semiconductor wafer, the mask having a transparent mask substrate with a surface, and the structures being formed by transparent and opaque, or semitransparent, phase-shifting sections in a first region of the mask and being formed by phase-shifting trenches in the mask substrate in a second region of the mask, the method comprising:
   providing a mask blank with the mask substrate;
   providing a light-absorbing absorber layer on or above the surface;
   providing a photosensitive first resist layer on the absorber layer;
   performing a lithography step to define a size and position of the second region with respect to the first region and to transfer the structures to be formed in the first and in the second region into the first resist layer;
   transferring the structures formed in the first resist layer into the absorber layer;
   after transferring the structures into the absorber layer, forming the transparent and opaque sections with the patterned absorber layer in the first region;
   after forming the transparent and opaque sections, defining the structures in the second region;
   after defining the structures in the second region, removing the first resist layer;
   applying a photosensitive second resist layer;
   patterning the second resist layer, the second resist layer being almost completely opened in the second region;
   etching the trenches into the uncovered mask substrate only with the patterned absorber layer in the second region as a hard mask;
   removing the hard mask; and
   removing the second resist layer.

2. The method as claimed in claim 1, further comprising:
   producing the phase-shifting sections, including providing the mask blank with a semitransparent, phase-shifting layer arranged on the surface, below the absorber layer;
   removing the phase-shifting layer uncovered in openings of the patterned absorber layer, the phase-shifting layer being patterned;
   removing the hard mask;
   after removing the hard mask, removing the phase-shifting layer in the second region; and
   after removing the second resist layer, removing the absorber layer in the first region, so that, in the first region, the semitransparent, phase-shifting sections emerge from the patterned phase-shifting layer.

3. The method as claimed in claim 2, wherein the phase-shifting layer is MoSi.

4. The method as claimed in claim 1, wherein a depth of the trenches is provided such that a light beam transmitted by the mask substrate within the trenches has a phase shift of half a wavelength relative to a light beam transmitted by the mask substrate through the surface outside the trenches.

5. The method as claimed in claim 1, wherein the size and the position of the second region with respect to the first region are defined by an outer edge that completely surrounds the hard mask.

6. The method as claimed in claim 5, wherein the outer edge is at a distance from openings in the hard mask that define the structures in the second region.

7. The method as claimed in claim 6, wherein the distance between the outer edge and the openings is a value in the range between 50 and 100 nanometers.

8. The method as claimed in claim 5, wherein the outer edge is a distance from the opaque or phase-shifting sections in the first region.

9. The method as claimed in claim 8, wherein the distance between the opaque or phase-shifting sections is a value in the range between 70 and 150 nanometers.

10. The method as claimed in claim 8, further comprising:
patterning the second resist layer by conducting a second lithography step and a development step, so that the outer edge and an overlap region extending along the outer edge within the hard mask are covered by the second resist layer.

11. The method as claimed in claim 5, further comprising:
patterning the second resist layer by conducting a second lithography step and a development step, so that the outer edge and an overlap region extending along the outer edge within the hard mask are covered by the second resist layer.

12. The method as claimed in claim 11, wherein a width of the extending overlap region covers the mask substrate in the context of an alignment accuracy.

13. The method as claimed in claim 11, wherein the hard mask and, if provided, the underlying phase-shifting layer are removed by means of an etching process with a defined undercut under the second resist layer.

14. The method as claimed in claim 11, wherein, in order to remove the hard mask and, if provided, the underlying phase-shifting layer,
effecting a third lithography step to enlarge an opening of the second resist layer in the second region, so that the hard mask and a region of the mask substrate that extends along the outer edge are uncovered, and
the hard mask and, if provided, the underlying, phase-shifting layer are removed by an etching process.

15. The method as claimed in claim 1, wherein the mask substrate is formed of quartz.

16. The method as claimed in claim 1, wherein the material for the absorber layer is chrome.

17. A method for fabricating a mask for a lithographic imaging of structures on the mask onto a semiconductor wafer, the mask having a transparent mask substrate with a surface with a first and a second region and, in the first region, the surface being planar and the structures being formed by transparent and opaque, or semitransparent, phase-shifting sections and, in the second region, being formed by transparent and opaque, or semitransparent, phase-shifting elevations and transparent depressions in the mask substrate, the second region containing a partial region and, in the partial region, the structures being formed by transparent elevations and transparent depressions in the mask substrate, the method comprising:
providing a mask blank with the mask substrate;
providing a light-absorbing absorber layer on or above the surface;
providing a photosensitive first resist layer provided on the absorber layer;
performing a first lithography step to transfer the structures to be formed in the first and in the second region being transferred into the first resist layer;
transferring the structures formed in the first resist layer into the absorber layer;
forming the patterned absorber layer;
after transferring the structures into and forming the patterned absorber layer, forming the transparent and opaque sections in the first region and defining the structures in the second region;
after defining the structures in the second region, removing the first resist layer;
applying a photosensitive second resist layer;
patterning the second resist layer;
opening the second region;
etching depressions into the uncovered mask substrate only with the patterned absorber layer in the second region as a hard mask;
forming the opaque elevations and the transparent depressions;
applying a photosensitive third resist layer;
patterning the third resist layer;
opening the partial region;
removing the hard mask to form the transparent elevations; and
removing the third resist layer.

18. The method as claimed in claim 17, further comprising:
providing the mask blank with a semitransparent, phase-shifting layer arranged on the surface below the absorber layer;
removing the phase-shifting layer uncovered in openings of the patterned absorber layer;
after removing the hard mask, before removing the second resist layer, removing the phase-shifting layer;
forming the transparent elevations; and
after removing the third resist layer, removing the absorber layer in the first region and in the second region, so that the semitransparent, phase-shifting sections are formed in the first region and the semitransparent phase-shifting elevations are formed in the second region.

19. The method as claimed in claim 18, wherein the phase-shifting layer is formed of MoSi.

20. The method as claimed in claim 17, wherein a height difference between the depressions and the elevations is such that a light beam transmitted by the mask substrate within the depressions has a phase shift of half a wavelength relative to a light beam transmitted by the mask substrate through the transparent elevations.

21. The method as claimed in claim 17, wherein the mask substrate is formed of quartz.

22. The method as claimed in claim 17, wherein the absorber layer is formed of chrome.

23. A method, for fabricating a mask for a lithographic imaging of structures on the mask onto a semiconductor wafer, the mask having a transparent mask substrate with a surface with a first and a second region and, in the first region, the surface being planar and the structures being formed by transparent and opaque, or semitransparent, phase-shifting sections and, in the second region, being formed by transparent and opaque, or semitransparent, phase-shifting elevations and transparent depressions in the mask substrate, the second region containing a partial region and, in the partial region, the structures being formed by transparent elevations and transparent depressions in the mask substrate, comprising:
providing a mask blank with the mask substrate;
providing a light-absorbing absorber layer on or above the surface;
providing a photosensitive first resist layer provided on the absorber layer;
performing a first lithography step to transfer the structures to be formed in the first and in the second region being transferred into the first resist layer;
transferring the structures formed in the first resist layer into the absorber layer;
forming the patterned absorber layer;
forming the transparent and opaque sections in the first region and defining the structures in the second region;
removing the first resist layer;
applying a photosensitive second resist layer:
patterning the second resist layer;
opening the second region;

etching depressions into the uncovered mask substrate with the patterned absorber layer in the second region as a hard mask;

forming the opaque elevations and the transparent depressions;

applying a photosensitive third resist layer;

patterning the third resist layer;

opening the partial region;

removing the hard mask to form the transparent elevations; and removing the third resist layer, wherein a size and position of the partial region are defined by an outer edge of an opening in the third resist layer.

24. The method as claimed in claim 23, wherein the outer edge is provided at a distance from the transparent elevations in the partial region.

25. The method as claimed in claim 24, wherein the distance between the outer edge and the transparent elevations is a value in the range of between 50 and 100 nanometers.

26. The method as claimed in claim 23, wherein the outer edge is at a distance from the opaque or phase-shifting sections and elevations.

27. The method as claimed in claim 26, wherein the distance between the opaque or phase-shifting sections and elevations is a value in the range between 70 and 150 nanometers.

* * * * *